United States Patent
Martinelli et al.

(10) Patent No.: US 8,284,623 B2
(45) Date of Patent: Oct. 9, 2012

(54) ELECTRONIC DEVICE COMPRISING NON VOLATILE MEMORY CELLS AND CORRESPONDING PROGRAMMING METHOD

(75) Inventors: Andrea Martinelli, Nembro (IT); Pierguido Garofalo, San Donato Milanese (IT); Graziano Mirichigni, Pietracamela (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/053,723

(22) Filed: Mar. 22, 2011

(65) Prior Publication Data

US 2011/0170361 A1 Jul. 14, 2011

Related U.S. Application Data

(63) Continuation of application No. 12/388,656, filed on Feb. 19, 2009, now Pat. No. 7,940,590, which is a continuation of application No. 11/713,074, filed on Feb. 28, 2007, now Pat. No. 7,512,032.

(30) Foreign Application Priority Data

Mar. 28, 2006 (IT) .............................. MI2006A0585
Mar. 31, 2006 (IT) .............................. MI2006A0627

(51) Int. Cl.
*G11C 7/00* (2006.01)

(52) U.S. Cl. .................. 365/204; 365/203; 365/185.25; 365/185.13; 365/185.17

(58) Field of Classification Search .................. 365/203, 365/204, 185.13, 185.17, 185.25
See application file for complete search history.

(56) References Cited

U.S. PATENT DOCUMENTS

| | | | |
|---|---|---|---|
| 4,394,748 A | 7/1983 | Campbell, Jr. | |
| 5,182,726 A | 1/1993 | Schreck et al. | |
| 5,315,541 A | 5/1994 | Harari et al. | |
| 5,539,688 A * | 7/1996 | Yiu et al. .................. | 365/185.18 |
| 5,691,935 A | 11/1997 | Douglass | |
| 6,005,794 A | 12/1999 | Sheffield et al. | |
| 6,091,629 A * | 7/2000 | Osada et al. .................. | 365/156 |
| 6,567,294 B1 | 5/2003 | Yochum | |
| 6,567,315 B2 * | 5/2003 | Takase et al. ............. | 365/185.28 |
| 6,618,302 B2 * | 9/2003 | Terzioglu et al. ............ | 365/200 |
| 6,707,316 B2 * | 3/2004 | Afghahi et al. .................. | 326/86 |
| 6,781,904 B2 | 8/2004 | Lee et al. | |
| 6,859,392 B2 * | 2/2005 | Abedifard et al. ........ | 365/185.13 |
| 7,085,157 B2 | 8/2006 | Tanaka et al. | |
| 7,085,178 B1 * | 8/2006 | Proebsting et al. ...... | 365/189.11 |
| 7,145,806 B2 | 12/2006 | Kawai | |
| 7,187,606 B1 * | 3/2007 | Goel ............................. | 365/203 |
| 7,323,741 B2 * | 1/2008 | Otsuga et al. .................. | 257/316 |
| 7,366,025 B2 * | 4/2008 | Maayan .................... | 365/185.28 |
| 7,512,032 B2 * | 3/2009 | Martinelli et al. ........ | 365/230.06 |
| 7,580,295 B2 * | 8/2009 | Lee et al. .................. | 365/189.02 |

(Continued)

Primary Examiner — Viet Q Nguyen
(74) Attorney, Agent, or Firm — Dorsey & Whitney LLP

(57) ABSTRACT

A device with non volatile memory cells, with optimized programming, of the type comprising a sector of matrix memory cells organized in rows and columns, with the columns organized in a plurality of global bit-lines associated with at least one plurality of local bit-lines and respectively enabled by a first select signal and by at least one second select signal generated by a decoder, these columns being associated with at least one program load PL controlled by a logic circuit and suitable for applying a programming pulse to a plurality of cells belonging to the enabled bit-lines, comprising a plurality of discharge transistors, each associated with a corresponding column controlled by a control signal complementary to the control signal of the adjacent discharge transistor.

14 Claims, 8 Drawing Sheets

U.S. PATENT DOCUMENTS

| | | | |
|---|---|---|---|
| 7,649,791 B2 * | 1/2010 | Martinelli et al. | 365/205 |
| 7,940,590 B2 * | 5/2011 | Martinelli et al. | 365/204 |
| 2004/0088470 A1 | 5/2004 | Kawamura et al. | |
| 2004/0188714 A1 | 9/2004 | Scheuerlein et al. | |
| 2005/0052999 A1 | 3/2005 | Oliver et al. | |
| 2005/0141282 A1 | 6/2005 | Abedifard et al. | |
| 2006/0083078 A1 | 4/2006 | Sforzin et al. | |

* cited by examiner

| ADD<2:0> | YN<7:0> |
|---|---|
| 000 | 0 |
| 001 | 1 |
| 010 | 2 |
| 011 | 3 |
| 100 | 4 |
| 101 | 5 |
| 110 | 6 |
| 111 | 7 |

FIG. 6A

| ADD<4:3> | YO<3:0> |
|---|---|
| 00 | 0 |
| 01 | 1 |
| 10 | 2 |
| 11 | 3 |

FIG. 6B

| ADD<2:0> | YN<7:0> |
|---|---|
| 000 | 0 |
| 001 | 1 |
| 010 | 2 |
| 011 | 3 |
| 100 | 4 |
| 101 | 5 |
| 110 | 6 |
| 111 | 7 |

FIG. 14A

| ADD<4,3,0> | YO<7:0> |
|---|---|
| 000 | 0 |
| 001 | 1 |
| 010 | 2 |
| 011 | 3 |
| 100 | 4 |
| 101 | 5 |
| 110 | 6 |
| 111 | 7 |

FIG. 14B

| ADD<0> | M3_DISCH<1:0> |
|---|---|
| 0 | 1 |
| 1 | 0 |

FIG. 14C

| ADD <2:0> | YN <7:0> |
|---|---|
| 0 0 0 | 0 |
| 0 0 1 | 1 |
| 0 1 0 | 2 |
| 0 1 1 | 3 |
| 1 0 0 | 4 |
| 1 0 1 | 5 |
| 1 1 0 | 6 |
| 1 1 1 | 7 |

| ADD <2> | M3_DISCH <1:0> |
|---|---|
| 0 | 1 |
| 1 | 0 |

| ADD <4:2> | YO <7:0> |
|---|---|
| 0 0 0 | 0 |
| 0 0 1 | 1 |
| 0 1 0 | 2 |
| 0 1 1 | 3 |
| 1 0 0 | 4 |
| 1 0 1 | 5 |
| 1 1 0 | 6 |
| 1 1 1 | 7 |

| STEP S | PROG BL (YO,YN) | DISCH BLs & NEXT YO (YO DISCH->YO NEXT, M3_DISCH) |
|---|---|---|
| 0 | (0,0) | |
| 1 | (0,1) | (7->,ODD) |
| 2 | (0,2) | |
| 3 | (0,3) | |
| 4 | (1,4) | |
| 5 | (1,5) | (0->2,EVEN) |
| 6 | (1,6) | |
| 7 | (1,7) | |
| 8 | (2,0) | |
| 9 | (2,1) | (1->3,ODD) |
| 10 | (2,2) | |
| 11 | (2,3) | |
| 12 | (3,4) | |
| 13 | (3,5) | (2->4,EVEN) |
| 14 | (3,6) | |
| 15 | (3,7) | |
| " | " | " |
| 28 | (7,4) | |
| 29 | (7,5) | (6->0,EVEN) |
| 30 | (7,6) | |
| 31 | (7,7) | |

| STEP | PROG BL (YO,YN) | DISCH BLs & NEXT YO (YO DISCH->YO NEXT,M3_DISCH) |
|---|---|---|
| 0 | (0,0) | (7->1,ODD) |
| 1 | (1,1) | (0->0,EVEN) |
| 2 | (1,1) | (1->1,ODD) |
| 3 | (1,3) | (0->0,EVEN) |
| 4 | (0,4) | (1->1,ODD) |
| 5 | (1,5) | (0->0,EVEN) |
| 6 | (0,6) | (1->1,ODD) |
| 7 | (1,7) | (0->2,EVEN) |
| 8 | (2,0) | (1->3,ODD) |
| 9 | (3,1) | (2->2,EVEN) |
| 10 | (2,2) | (3->3,ODD) |
| 11 | (3,3) | (2->2,EVEN) |
| 12 | (2,4) | (3->3,ODD) |
| 13 | (3,5) | (2->2,EVEN) |
| 14 | (2,6) | (3->3,ODD) |
| 15 | (3,7) | (2->4,EVEN) |
| ... | ... | ... |
| 28 | (6,4) | (7->7,ODD) |
| 29 | (7,5) | (6->6,EVEN) |
| 30 | (6,6) | (7->7,ODD) |
| 31 | (7,7) | (6->0,EVEN) |

FIG. 13

ELECTRONIC DEVICE COMPRISING NON VOLATILE MEMORY CELLS AND CORRESPONDING PROGRAMMING METHOD

CROSS REFERENCE TO RELATED APPLICATIONS

This application is related to U.S. patent application Ser. No. 11/713,081, entitled NON VOLATILE MEMORY DEVICE ARCHITECTURE AND CORRESPONDING PROGRAMMING METHOD, which has a common filing date and owner and which is incorporated by reference.

This application is a continuation of U.S. patent application Ser. No. 12/388,656, filed on Feb. 19, 2009, now U.S. Pat. No. 7,940,590 which is a continuation of U.S. patent application Ser. No. 11/713,074, filed on Feb. 28, 2007, which issued as U.S. Pat. No. 7,512,032.

PRIORITY CLAIMED

This application claims priority from Italian patent applications No. MI2006A000585, filed Mar. 28, 2006 and No. MI2006A000627, filed Mar. 31, 2006, which are incorporated herein by reference.

TECHNICAL FIELD

The present invention relates generally to a non volatile memory device comprising at least one sector with memory cells matrix organized in rows and columns, the columns being organized in a plurality of global bit-lines (GBLi), associated with at least one plurality of local bit-lines (LBLij) and respectively enabled by a first select signal (YNi) and by at least one second select signal (YOj) generated by a decoder.

In particular, according to an embodiment of the invention, the columns are associated with at least one Program Load PL, controlled by, a logic circuit, suitable for pulse programming of a plurality of cells belonging to the enabled bit-lines.

Another embodiment of the invention further relates generally to an architecture of non-volatile memory devices, in particular of the Flash-Nor type.

Yet another embodiment of the invention relates to a programming method of a non volatile memory device.

BACKGROUND

As it is well known, the more widespread use of multimedia applications and the expansion of these applications need a greater amount of data to be manipulated and to be stored within the shortest time possible.

To fulfill this need, non volatile memory structures use matrixes of memory cells, for example of the NOR Flash type.

A main advantage of NOR Flash memories is that an update operation of a group of columns is carried out in parallel and simultaneously on all the selected cells belonging to each row of the group.

FIG. 1 shows, by means of a flow chart, a method for programming a group of columns of an architecture with Flash-Nor memory cells.

A programming cycle comprising an alternated repetition of programming and verify steps allows to program suitable selected cells.

During the programming step, the selected cells are biased at suitable programming voltages and subjected to a pulses sequence until a desired threshold is attained.

A non volatile memory device architecture currently used is shown in FIG. 2. The architecture 1 comprises a partition 2 of a matrix of memory cells associated with a control circuit structure 4 for the management of the programming of the entire partition 2.

The partition 2 is divided into a plurality of sectors 10 adjacent to each other and each comprising a predetermined number of columns or bit-lines and a same number of rows or word-lines. Each sector 10 is associated with a respective logic circuit 6.

In particular, each sector 10 and a corresponding logic circuit 6, as shown in FIG. 3, define a block 5 to be programmed.

Each logic circuit 6 comprises a high voltage circuit HV connected to a P_pulse signal for the control of a program load PL for pulse programming of selected cells of the sector 10.

"Programming per row" is programming which sequentially selects and programs cells belonging to a same row or word line WL.

For each block 5 to be programmed, the cells being programmed belong to a same row or word-line WL, selected in the usual way, and to columns sequentially selected by means of suitable select signals YN,Y0 generated by a decoder 12.

In the embodiment shown, a cell matrix is considered with three number of metallizations and, in particular, a first lower level M1 and a level M3 where a plurality of columns or local bit-lines LBL and a plurality of global bit-lines GBL are respectively defined, and a second level M2 where the rows or word-lines WL are defined.

In the example of FIG. 3, eight global bit-lines GBL GBLi i=0, . . . 7 and 32 local bit-lines LBLi are connected in groups of four to one global bit-line GBLi.

The global bit-lines GBLi i=0, . . . 7 are enabled by means of a first select signal YNi, generated by the decoder 12, which activates a corresponding first enable transistor Ti i=0, . . . 7 interposed between each global bit-line GBLi i=0, . . . 7 and a control line 50 shared by all the global bit-lines GBLi.

For each global bit-line GBLi i=0, . . . 7, corresponding local bit-lines LBLij j=0 . . . 3, is enabled by a same second select signal YO, generated by the decoder 12, which activates a corresponding second enable transistor Tij i=0, . . . 7 j= 0, . . . 3 interposed between each local bit-line LBLij and the corresponding global bit-line GBLi.

The block 5 to be programmed of FIG. 3 also has a discharge circuit 13 comprising a discharge transistor Ts, interposed between the control line 50 and a ground reference, controlled by a discharge signal YNS. The discharge transistor Ts is activated at the end of the programming of a cell by means of programming pulses generated by the program load PL and allows to discharge possible high voltages present on the local bit-line LBLij which comprises this programmed cell.

The block 5 to be programmed also comprises sense amplifiers SA to read the programmed cells of the sector 10.

The architecture of such blocks 5 to be programmed allows a programming parallelism which depends on the number of the present program loads PL. If these program loads PL are equal to the number of sense amplifiers SA, the same number of cells can be simultaneously programmed and read in parallel.

For each block 5 to be programmed a programming cycle between two successive verify steps provides the pulses programming of all the cells belonging to a same enabled word-line.

In particular, the first select signal YNi sequentially enables all the global bit-lines GBLi of the sector 10 while the second select signal YOj enables a same local bit-line LBLij for each group.

The signal YOj switches when all the local bit-lines LBLij of a group have been enabled, i.e., after a complete sequential switch of the first select signal YNi.

Considering an entire partition 2 of the matrix, the circuit structure 4 allows, if requested, a programming parallelism between more devices 5 and the maximum parallelism is defined by the number of the program loads PL.

Moreover, in this case, the first select signal YNi is unique for the entire partition 2 while the second select signal YOj is relative to each sector 10 of the partition 2.

FIG. 4 shows the waveforms of the signals used during the programming step, in a sector 10, relative to the storage of two cells belonging to a same word-line and belonging to corresponding local bit-lines LBLij of the group respectively associated with global bit-lines alternatively activated by the first signal YN3 and by the first select signal YN4.

Let us suppose, for example, that j is equal to 0 and thus the active local bit-lines are LBL30 and LBL40.

The programming provides a first select step H1 where the first select signal YN3 is activated, i.e., in the specific case brought to the high logic level, this signal enables the global bit-line GBL3 by activating the second select transistor T3.

Subsequently, a second real programming step H2 is provided during which the program load PL is updated by the logic circuit 6 and prepared for the programming of the enabled local bit-line LBL30 sending a programming pulse if the voltage value in the cell is not the desired one.

Thus, a third discharge step H3 is provided during which the discharge signal YNS, activated, controls the discharge transistor Ts discharging the possible high voltage present in the local bit-line LBL30.

Then, a new first step H1 follows and the deactivation of the discharge signal YNS the deactivation of the first select signal YN3 and the simultaneous activation of the signal YN4 which controls the second transistor T4 enabling the global bit-line GBL4 to allow the programming of the cell belonging to the local bit-line LBL40 already enabled by the second select signal YO0.

A new second step H2 allows to control the program load PL and thus to apply pulses, if necessary, to the active cell.

Subsequently, a new third step H3 allows to discharge the possible high voltages accumulated in the local bit-line LBL40.

The programming goes on through successive steps so as to program all the cells of the sector 10 belonging to a same row WL.

The memory device previously described, although satisfactory, shows however some drawbacks.

In fact, the time of the third discharge step H3 is particularly high and this affects the programming speed in an unfavorable way. Considering for example a discharge time of the bit-line of the order of some tens of nanoseconds, the contribution is relevant already with a programming pulse of the program load PL of 300 ns.

BRIEF DESCRIPTION OF THE DRAWINGS

The characteristics and the advantages of the device and of the method according to the present invention will be apparent from the following description of an embodiment thereof given by way of indicative and non limiting example with reference to the annexed drawings.

FIGS. 6a and 6b are address tables for the activation of enable signals of the device of FIG. 5.

FIG. 13 is a summarizing table under programming and discharging of successive columns relative to the device of FIG. 11.

FIGS. 14a, 14b and 14c are address tables for the activation of enable signals of the device of FIG. 11.

DETAILED DESCRIPTION

Figure 1:
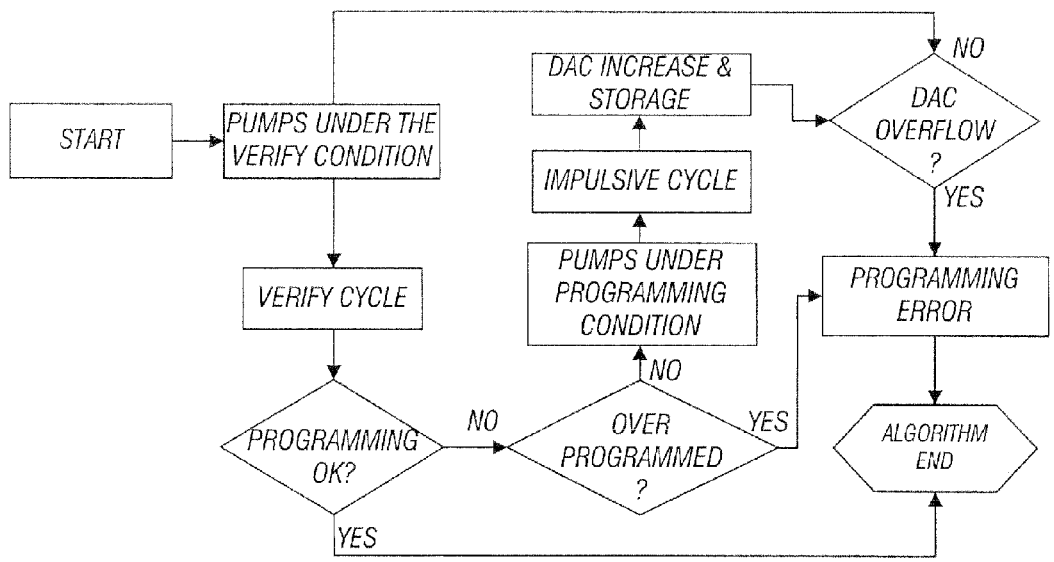
FIG. 1 is a flow chart of a memory device realized and programmed according to the prior art.
Figure 2:
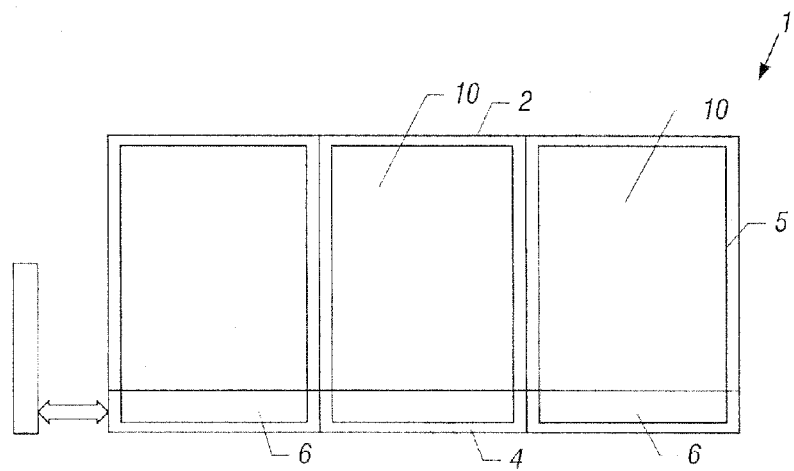
FIG. 2 is a schematic view of a known structure architecture of a non volatile memory.
Figure 3:
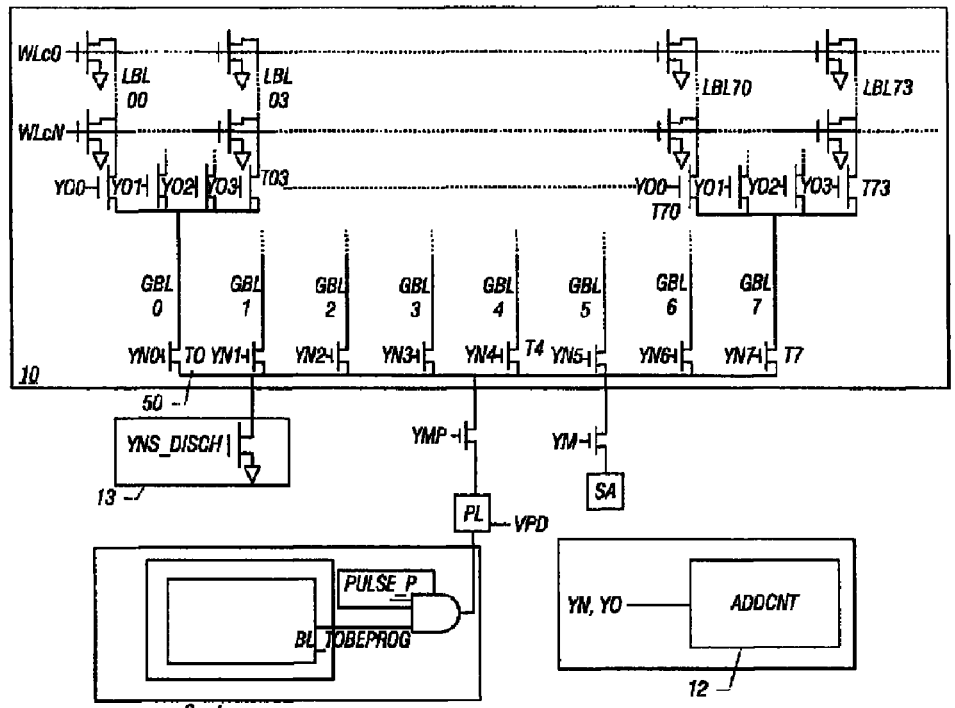
FIG. 3 is a block to be programmed realized according to the prior art and comprises a sector 10 associated with a program load P1 and with a control circuitry.
Figure 4:
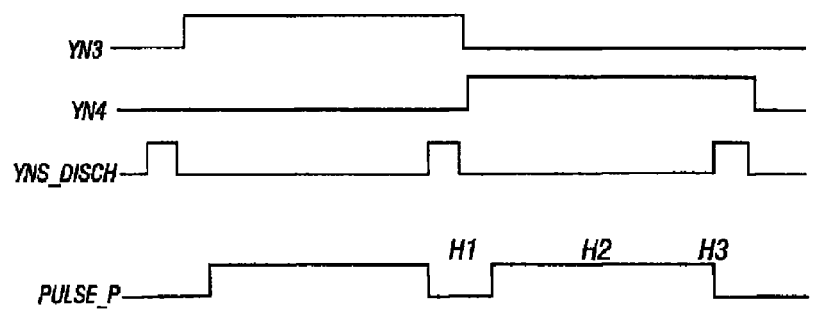
FIG. 4 is a part of the waveforms generated by the block shown in FIG. 3 during a programming step of two consecutive global bit-lines.

A plurality of devices 100, adjacent to each other, define an architecture of non volatile memory.

In particular, each device 100 comprises at least one part of a matrix of non volatile memory cells or sector 10, organized in rows or word-lines WL intersected by columns or bit-lines BL adjacent to each other.

The device 100 comprises a logic circuit 6 which controls a program load PL suitable for a pulse programming.

According to the present embodiment, the sectors 10 comprise a defined number of columns BL and all the rows WL of the matrix of cells, in other words each sector can be defined as a matrix "strip."

The logic circuit 6 allows to suitably enable a P_pulse signal, of the high voltage type, which controls a Program load PL which allows the selected cells to receive a sequential pulses programming.

"Programming per row" sequentially programs cells of the sector 10 which belong to a same row or word-line. The row or word-line may be selected in the known way.

The cells of the device 100 are subjected to a programming cycle defined by an alternated repetition of programming steps and of verify steps until a defined pattern is reached.

In dual mode, a device can be realized providing a solution with a "programming per column."

Figure 5:
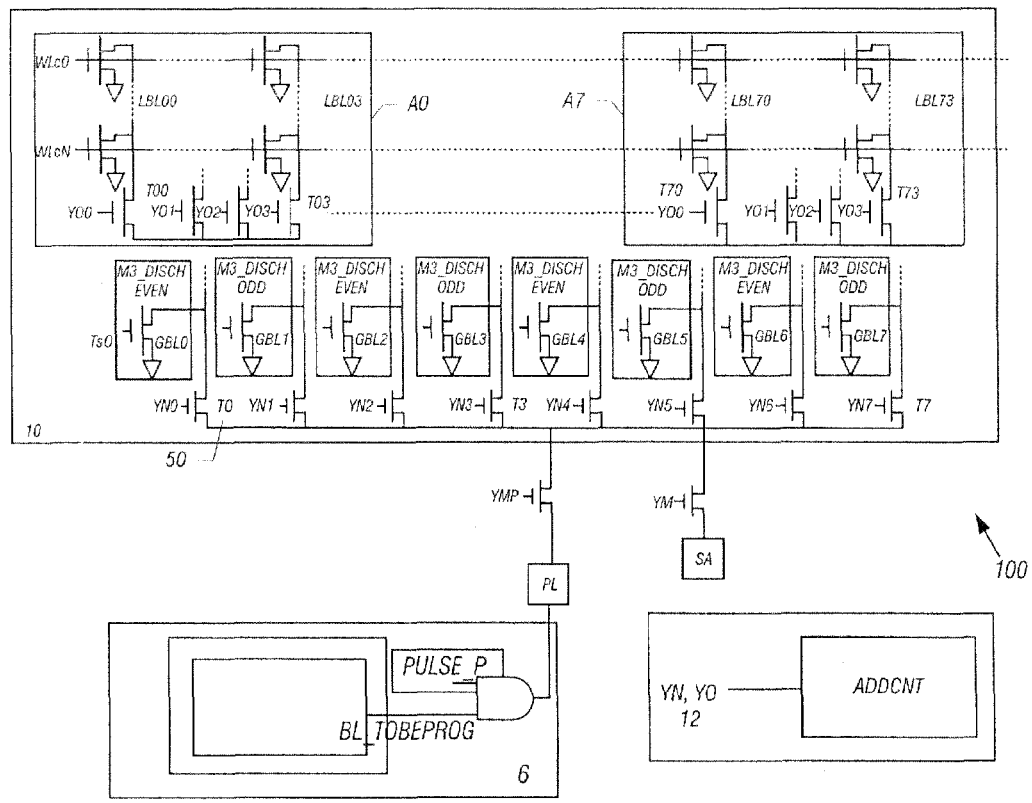
FIG. 5 is a memory electronic device realized according to the present invention.

In the example shown in FIG. 5, a decoder 12 generates enable signals YN, YO for enabling in sequence the columns or bit-lines BL of the sector 10. According to one embodiment, the decoder 12 is shared by a plurality of devices 100 of a partition of the matrix allowing a programming in parallel thereof.

The matrix of cells of the indicated embodiment has three metallization levels, with a first level M1 and a third level M3 suitable for defining a plurality of columns and respectively local bit-lines LBL associated, in a specific mode, with a plurality of global bit-lines GBL. A second level M2 defines the rows or word-lines WL. In other words, the lower metallization level M1 defines the local bit-lines LBL, the intermediate level M2 the word lines WL and the higher level M3 the global bit-lines GBL.

In particular, in the present example, there are eight global bit-lines GBL GBLi i=0 . . . 7, each associated with a group Ay of four consecutive local bit-lines LBLj j=0 . . . 3.

There are 32 local bit-lines and eight groups Ay y=0 . . . 7 in one embodiment.

Other similar solutions could provide a device with a matrix realized with a different number of metallizations; in this case a suitable decoder manages a different and corresponding number of enable signals YN, YO or a decoder could be provided with a greater multiplicity of column decoder managed by a corresponding number of enable signals.

In the present embodiment, the decoder 12 generates a first select signal YNi i=0 . . . 7 suitable for activating a first enable transistor Ti i=0, . . . 7 connected between a corresponding global bit-line GBLi i=0 . . . 7 and a control line 50, shared by all the global bit-lines GBLi of the sector 10.

The decoder 12 generates a second select signal YOj j=0 . . . 3 suitable for activating a second enable transistor Tij i=0 . . . 7, j=0 . . . 3 connected between the local bit-lines LBLj j=0, . . . 3 of each group Ay and the corresponding global bit-line GBLi i=0 . . . 7.

Hereafter, bit-lines belonging to different groups Ay y=0 . . . 3 and enabled simultaneously by a same second select signal YOj j=0 . . . 3 will be indicated as set of local bit-lines LBLij.

In one embodiment, the device 100 comprises a sense amplifier SA to successively read the programmed cells. Suitable transistors YMP and YM interposed between the control line 50 and respectively the program load PL and the sense amplifier SA enable the programming and the reading of the cells of the sector 10. The amplifiers YMP and YM to synchronize these operations with suitable operations to be performed simultaneously in other devices of the partition.

Advantageously, according to an embodiment of the present invention, the device 100 has a plurality of discharge transistors Tsi i=0 . . . 7, each associated with a corresponding global bit-line GBLi i=0 . . . 7 and controlled by a control signal M3_Odd and M3_Even complementary to the control signal of the adjacent discharge transistor Tsi.

Suitably, the discharge transistors Tsi i=0, . . . 7 are inserted between each global bit-line GBLi i=0 . . . 7 and a ground reference and are alternatively controlled by a first control signal M3_Odd and by a second control signal M3_Even complementary to each other.

Advantageously, the discharge transistors Tsi i=0 . . . 7 are activated for discharging the possible high voltage present in the local bit-lines LBLij after the programming.

During the programming of a cell of a local bit-line LBLj enabled and associated with a global enabled bit-line GELi i=0 . . . 7, the corresponding discharge transistor Tsi i=0 . . . 7 is deactivated. The discharge transistor Tsi is subsequently activated during the programming of a cell of a local bit-line LBLj belonging to the same set, i.e., enabled by the same second select signal YOj, and associated with a successive global enabled bit-line GBLi i=0 . . . 7.

In substance, according to an embodiment of the invention, a local bit-line LBLij can be discharged while, simultaneously, a cell belonging to a successive bit-line is programmed.

The device 100 realized according to an embodiment of the invention shows the single discharge transistors Tsi for each global bit-line GBLi which discharge the high voltage of the bit-lines programmed during the activation of a successive global bit-line GBLi i=0 . . . 7.

Figure 6:
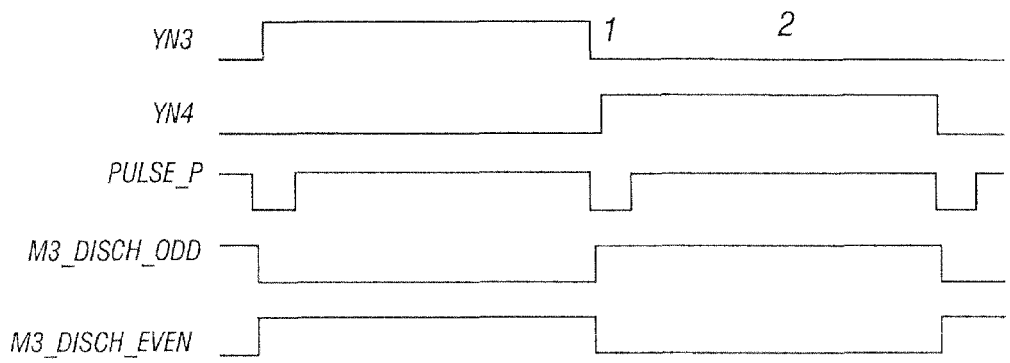
FIG. 6 is a part of the waveforms generated by the device of FIG. 5 during a programming step of two consecutive global bit-lines.

As regards the operation of the device 100, FIG. 6 shows the waveforms of the signals generated during the activation of first select signals, in particular YN3 and YN4, to alternatively and sequentially enable the global bit-lines GBL3 and GBL4 for programming the cell selected by means of the activation of a second select signal YOj j=0 . . . 3.

The second select signal YOj, generated by the decoder 12, simultaneously enables a set of local bit-lines LBLij, one for each group Ay y=0 . . . 7.

The decoder 12 of the device 100, for each second select signal YOj, sequentially activates the first select signals YNi i=0 . . . 7, activating first enable transistors Ti i=0 . . . 7 and enabling corresponding global bit-lines GBLi i=0 . . . 7. In the example shown, the first select signal YN3 is brought, according to a specific convention, to a high voltage level, activating the enable transistor T3 which allows the enabling of the global bit-line GBL3.

The logic circuit 6 deactivates the P_pulse signal, while simultaneously the first and the second control signal M3_Even and M3_Odd switch. In the specific case shown, there is the activation of the first signal M3_Even and then the deactivation of the second signal M3_Odd to discharge the possible high voltage present in the local bit-line LBL2j just programmed and associated with the global bit-line GBL2 and to enable the programming of the local bit-line LBL3j of the set associated with the global bit-line GBL3.

Subsequently, the device 100 allows the activation of the P_pulse signal and the pulses programming by means of a program load PL controlled by the logic circuit 6 of the cell of the enabled local bit-line LBL3j j=0 . . . 3.

Subsequently, the decoder 12 disables the first select signal YN3 and sequentially activates the first successive select signal YN4, activating the enable transistor T4 and enabling the global bit-line GBL4.

The second select signal YOj is instead maintained unaltered, switching after a complete switch of the first select signal YNi i=0 . . . 7.

The device 100 thus allows the disabling of the P_pulse signal and the switching of the control signals M3_Even and M3_Odd. In particular, in the example shown, there is the activation of the second signal M3_Odd to discharge the high voltage present on the local bit-line LBL3j just programmed with the simultaneous deactivation of the complementary control signal M3_Even.

Subsequently, the program load PL, suitably controlled, programs the cell belonging to the local bit-line LBL4j j=0 . . . 3 activated by the second signal YOj j=0 . . . 3.

The device 100 according to the present embodiment provides for a complete switching of the first select signal YNi i=0 . . . 7 within a single idle time equal to the discharge time of the last local bit-line LBL74 associated with the global bit-line GBL7.

Instead, advantageously, during the programming of the remaining cells of the local bit-lines LBLij i=0 . . . 6 this discharge time is masked due to the presence of the discharge transistors controlled by complementary signals.

In fact, due to the presence of the single discharge transistors Tsi for each global bit-line GBLi, in some embodiments, the programming times are reduced, the local programmed bit-line LBLij is discharged during the programming of a successive local bit-line LBLij.

A column decoding of the device 100 is indicated in FIGS. 6a and 6b. In the present embodiment, for addressing 32 local bit-lines LBLij, associated with a single program load PL, p bits may be used for addressing first select signals YNi, i.e., p is equal to three ADD<2:0> for eight first select signals YNi i=0 . . . 7, while q bits may be used for addressing select signals YOj, i.e., q equal to two ADD<4:3> for four select signals YOj j=0 . . . 3.

Figures 7, 9A, 9B, 9C:
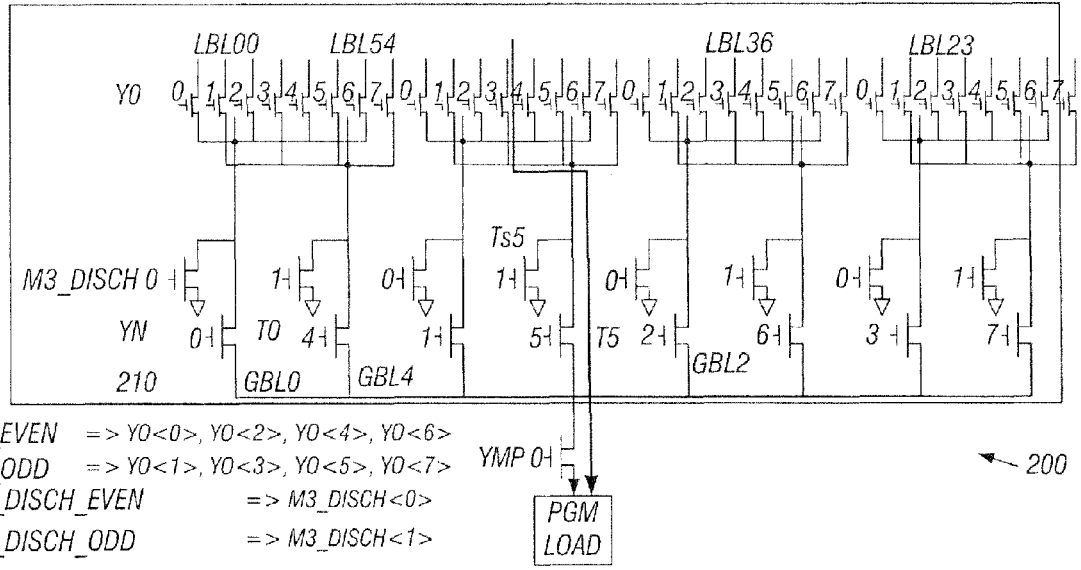
FIGS. 7 and 8 respectively are a second device realized according to an embodiment of the present invention and a relative part of the waveforms generated by this device during a programming step of two consecutive global bit-lines.
FIGS. 9a, 9b and 9c are address tables for the activation of enable signals of the device of FIG. 7.

FIG. 7 shows a second device 200, realized according to an embodiment of the invention.

In the following description, the same reference numbers as those used in the previously described embodiment for identifying details having the same structure and function will be maintained.

The second device 200 enables, due to a particular structural conformation, further reductions of the programming times in some embodiments.

The device 200 according to the embodiment shown in FIG. 7 shows a sector 210 which comprises eight global bit-lines GELi i=0 . . . 7 associated with 32 local bit-lines LBLij.

Advantageously, according to the present embodiment a group of eight consecutive local bit-lines LBLij are comb-shaped and associated with pairs of consecutive global bit-lines GBLi i=0 . . . 7. The groups of local bit-lines are thus in the number of four Ay y=0 . . . 3.

A decoder, not shown in the figure, generates corresponding first select signals YNi i=0 . . . 7 for enabling respective global bit-lines GBLi i=0 . . . 7.

Moreover, the decoder generates suitable second select signals YOj j=0 . . . 7 for enabling respective local bit-lines LBLij.

Advantageously, each global bit-line GBLi i=0 . . . 7 has a discharge transistor Tsi i=0 . . . 7 controlled by a control signal M3_Odd and M3_Even complementary to the control signal of the discharge transistor Tsi of the adjacent global bit-line GBLi i=0 . . . 7.

Suitably, the discharge transistors Tsi i=0, . . . 7 are inserted between each global bit-line GBLi i=0 . . . 7 and a ground reference and are alternatively controlled by a first control signal M3_Odd and by a second control signal M3_Even complementary to each other.

Advantageously, according to the present embodiment, the device 200 shows a particular arrangement of the global bit-lines GBLi with first four consecutive global bit-lines GBLi i=0 . . . 3 alternated to second four global bit-lines GBLi i=4 . . . 7.

The local bit-lines LBLij associated with the first or with the second four global bit-lines GBLi are enabled by second select signals YOj j=0 . . . 7, respectively even or odd, separately controlled.

Hereafter, bit-lines belonging to different groups Ay y=0 . . . 3 and enabled by a same second select signal YOj j=0 . . . 7 will be indicated as set of local bit-lines LBLij.

In particular, each second select signal YOj j=0 . . . 7 is maintained active during eight switches of the first select signals YNi i=0 . . . 7.

Advantageously, the second select signals YOj are sequentially enabled but offset with respect to each other by a period equal to four switches of the first select signals YNi allowing the simultaneous discharge of a set of bit-lines.

First and second control signals M3_Even and M3_Odd for the discharge of a set of programmed local bit-lines LBLij, switch with a frequency equal to four first select signals YNi.

In particular, then, the second device 200, at each four switches of the first select signal YNi i=0 . . . 7, programs the local bit-lines LBLij of a set and simultaneously discharges the local bit-lines LBLij of a just programmed set, alternating a set enabled by second select signals YOj equal to the odd ones.

Figures 8, 10:
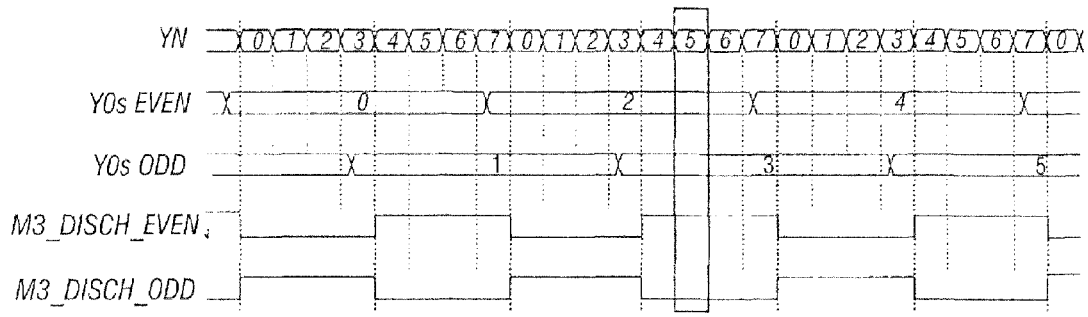
FIG. 10 is a summarizing table of the tables of FIGS. 9a, 9b and 9c relative to the programming and discharge of columns of the device of FIG. 7.

As shown in FIG. 8, the second device 200 switches the second select signals YOj in advance with respect to the corresponding first select signals YNi, to allow the set of local bit-lines LBLij to be programmed to be enabled prior to the sending of the pulses by the program load. However, the second select signals YOj switch, in any case after a time sufficient to allow the set of programmed local bit-lines LBLij to be discharged.

In particular, FIG. 8 shows a column decoding during a programming pulse on a local bit-line LBLij selected by a first signal YN5 and a second signal YO3, this evident due to the presence of a deactivated control signal M3_Odd.

Simultaneously, then, the second active control signal M3_Even allows the discharge of a set of local bit-lines LBLij selected by a second signal YO2.

Once the set of the four local bit-lines LBLi3 selected by the second odd signal YO3 and by the first signal YNi i=4,5, 6,7 has been programmed, the control signals M3_Even and M3_Odd switch and in particular the local bit-lines LBLi3 just programmed and selected by the first signal YNi i=4,5,6,7 are discharged and the program load PL programs the set of local bit-lines LBL4j selected by the first signal YNi i=0,1,2,3 and enabled by the same second signal YO4.

The second signal YO4 has been prepared prior to the change of the first select signal YNi so that the decoding of the bit-line anticipates the programming pulse by the program load PL and in any case after a time sufficient to discharge the set of local bit-lines LBL just programmed.

The device 200 shows a column decoding with second select signals YOj j=0 . . . 7, even and odd, that allows to alternatively program sets of local bit-lines LBLij, even and odd. Moreover, the complementary control signals M3_Even, M3_Odd allow to discharge the set of just programmed local bit-lines without any idle time simultaneously with the programming of a successive set activated by the second select signal YOj.

Advantageously, the device 200 shows a column decoding which is equivalent, to the operative purpose of an external addressing, to the decoding of the previously described device 100.

In fact, as shown in FIGS. 9a, 9b and 9c, for addressing 32 local bit-lines LBLij of the present embodiment, associated with a single program load PL with an independent control of eight second select signals YOj j=0 . . . 7, a number of 5 bits is necessary and thus for example ADD<4:0>.

A possible implementation provides to address eight global bit-lines GBLi i=0 . . . 7 with eight first select signals YNi using a number p of addressing bits, which, in the present case, is equal to three bits ADD<2:0>, moreover a number q of bits equal to three bits ADD<4:2 > are used for addressing second select signals YOj<7:0>.

Advantageously in the present embodiment, a bit of said p and q addressing bits, i.e., ADD<2>, is shared by the second select signals YOj j=0 . . . 7 and the first select signals YNi i= 0 . . . 7.

Suitably, moreover, the shared bit ADD<2> discriminates the second select signals YOj, even and odd, and controls the control signals M3_Even and M3_Odd for the discharge of the bit-lines after the programming.

FIG. 10 shows a table wherein a sequence is reported of local bit-lines LBLij programmed and discharged during a programming sequence of which the waveforms of the signals indicated in FIG. 8 represent an extract.

In particular, in the column on the right of the table, the local LBLij and global GBLi bit-lines which are discharged during the switch of the first select signals YNi as well as the switches of the second select signals Yoij necessary for a correct programming are indicated in a synthetic annotation.

It can be observed how, being the control signal for the discharge of a set of four bit-lines selected by first signals YNi, activated after the programming of the last bit-line of the set, only this bit-line is discharged at the end of the programming pulse, the other bit-lines of the set show an interruption of the programming pulse and then start themselves to discharge the possible residual high voltage through the memory cells themselves.

From an accurate analysis of simulations carried out at the Applicant's, the process of self-discharge of the bit-lines of the set is very contained and does not affect the programming efficiency. In fact, typically a time interval between the pulse of the first bit-line and of the last bit-line of a set is very contained with a threshold shift of each impulsed cell of the order of some tens of millivolts. In fact, the cell programmed for example at a high threshold value tends to "turn off" during the programming of the remaining cells of the set without however discharging, i.e., bringing to a ground reference value, the relative bit-line. The discharge of the cell thus does not have relevant effects on the overall programming and the discharge of each bit-line is concluded only with the activation of the discharge transistor, at the most at each four pulses.

FIG. 9 shows a third device 300, realized according to an embodiment of the invention.

In the following description the same reference numbers as those used in the previously described embodiment for identifying details having the same structure and function will be maintained.

The device 300 allows, thanks to a particular structural conformation, to discharge each local bit-line at the end of the programming of a cell contained therein.

The device 300 shows a sector 310 which comprises eight global bit-lines GBLi i=0 . . . 7 associated with 32 local bit-lines LBLij.

Advantageously, according to the present embodiment, a group of consecutive eight local bit-lines LBLij are comb-shape associated with pairs of consecutive global bit-lines GBLi i=0 . . . 7. The groups of local bit-lines are thus four Ay y=0 . . . 3.

A decoder, not shown in the figure, generates corresponding first select signals YNi i=0 . . . 7 for sequentially enabling respective global bit-lines GBLi i=0 . . . 7.

Moreover, the decoder generates suitable second select signals YOj j=0 . . . 7 for enabling respective local bit-lines LBLij.

Advantageously, each global bit-line GBLi i=0 . . . 7 has a discharge transistor Tsi i=0 . . . 7 controlled by a control signal M3_Odd and M3_Even complementary to the control signal of the discharge transistor Tsi of the adjacent global bit-line GBLi i=0 . . . 7.

Suitably, the discharge transistors Tsi i=0, . . . 7 are inserted between each global bit-line GBLi i=0 . . . 7 and a ground reference and are alternatively controlled by a first control signal M3_Even and by a second control signal M3_Odd complementary to each other.

Advantageously, according to the present embodiment, the third device 300 separately controls second even and odd select signals YOj j=0 . . . 7, activating them offset from a switch of the first select signal YNi and maintaining them active for successive eight switches.

Suitably, moreover, after each eight switches of first select signals YNi i=0 . . . 7, sequential second select signals Yoj, one being even and the other one being odd, are activated in pairs.

Hereafter, bit-lines belonging to different groups Ay y=0 . . . 3 and enabled by a same second select signal YOj j=0 . . . 7 will be indicated as set of local bit-lines LBLij.

Suitably, moreover, first and second control signals M3_Even and M3_Odd suitable for allowing a discharge of a bit-line switch at each switch of the first select signal YNi.

In this way, for each switch cycle of the first select signals YNi i=0 . . . 7 two sets of consecutive local bit-lines LBLij and in particular a set of local bit-lines, an even one and an odd one, are enabled and consequently programmed, with a pulse programming by means of a program load PL.

Advantageously, the device 300 at each switch of the first select signal YNi i=0 . . . 7 allows to discharge a just programmed local bit-line LBLij, for example "even" enabled by a second even select signal, while, simultaneously, there is the programming of an "odd" local bit-line LBLij and vice versa.

Moreover, for each group Ay y=0 . . . 3 and for each complete switch of the first select signal YNi there is the programming of two sets of local bit-lines LBLij, an "even" one and an "odd" one.

It is good to highlight, as shown in FIG. 10, that the third device 300 switches the second select signals YOj in advance with respect to corresponding first select signals YNi i=0 . . . 7, this for allowing the first local bit-line LBLij of the set to be programmed to be enabled prior to the sending of the pulses by the program load. However, the second select signals YOj switch in any case after a time sufficient so that the last local bit-line LBLij of the set just programmed can be discharged.

The third device 300 consecutively allows to program, in an alternated way, two sets of consecutive local bit-lines LBLij, an even one and an odd one, and to discharge each local bit-line at the end of the programming pulse without any idle time since the control signals switch at each switch of the first select signal YNi i=0 . . . 7.

Advantageously, also the third device 300 shows a column decoding which is equivalent, to the operative purpose of an external addressing, to the decoding of the previously described device 100.

Figure 12:
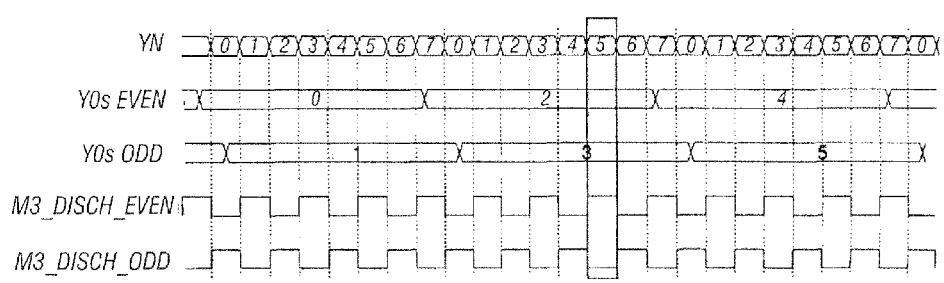

In fact, as shown in the table of FIG. 12, for addressing 32 local bit-lines LBLij of the present embodiment associated with a single program load PL with an independent control of eight second select signals YOj j=0 . . . 7, 5 bits are necessary and thus for example an address ADD<4:0>.

A possible implementation, as shown in the tables of FIGS. 14a, 14b and 14c, provides to address eight global bit-lines GBLi i=0 . . . 7 with eight first select signals YNi by using three bits ADD<2:0>, moreover three bits ADD<4,3,0> are used for addressing second select signals YOj<7:0>.

Advantageously, in the present embodiment, an addressing bit ADD<0> is shared by the second select signals Yoj j=0 . . . 7 and the first select signals YNi i=0 . . . 7.

Moreover, suitably in the present embodiment, the shared bit ADD<0> discriminates the second select signals YOj, even one and odd one, and controls the control signals M3_Even and M3_Odd for the discharge of a bit-line after programming.

Figure 11:
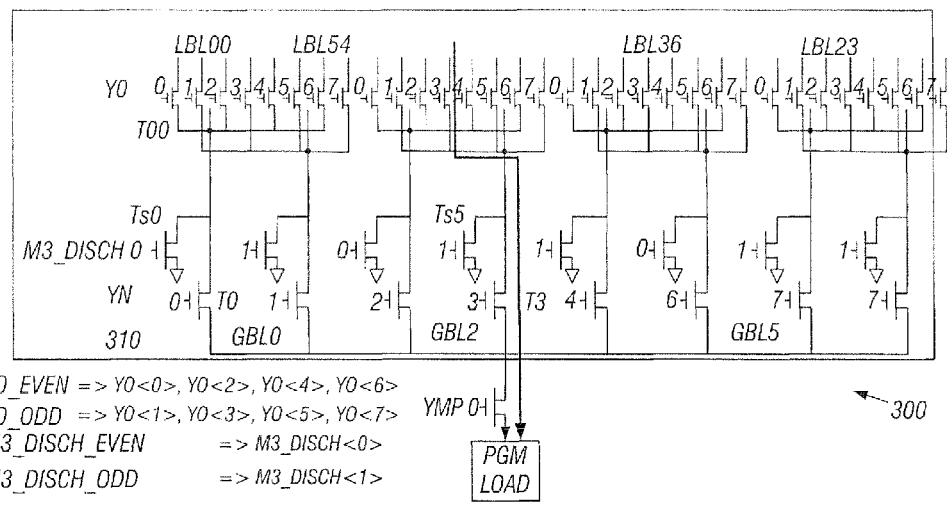
FIGS. 11 and 12 respectively are a third device and a relative part of waveforms.

The table 13 shows a sequence of local bit-lines LBLij programmed and discharged during a programming sequence of which the waveforms of the signals indicated in FIG. 11 represent an extract.

In particular, in the column on the right of the table the switches of second select signals Yoij as well as of control signals for a correct programming and discharge are indicated in a synthetic annotation.

Yet another embodiment of the present invention provides an architecture comprising a plurality of memory devices flanked to each other and a circuit structure. In particular, the circuit structure comprising each a logic circuit associated with each device and an additional portion suitable for coordinating the execution of parallel programming among more devices.

Such an architecture, comprising devices of the above described type, devices 100, second devices 200 or third devices 300, allows a programming of a enabled local bit-lines belonging to devices simultaneously flanked with a discharge of a just programmed bit-line. This allows to remarkably reduce the requested programming times.

A further embodiment of the invention provides a programming method of a device of the non volatile memory type, with optimized programming, of the type comprising a sector 10,210,310 of matrix memory cells, organized in rows WLi and columns. The columns being organized in a plurality of global bit-lines GBLi i=0 . . . 7 associated with at least one plurality of local bit-lines LBLij and enabled respectively by a first select signal YNi and by at least one second select signal YOj, generated by a decoder 12.

The columns being associated with at least one program load PL controlled by a logic circuit 6 and suitable for applying a programming pulse to a plurality of cells belonging to the local enabled bit-lines LBLij.

The method provides the alternated repetition of programming steps and of verify steps.

In particular, the programming step provides a first select step during which the decoder 12 activates a first select signal YNi, which enables a corresponding global bit-line GBLi.

The decoder 12 also activates a second select signal YOj which enables a set of local bit-lines LBLij, one for each global bit-line GBLi.

Suitably, the second enable signal YOj switches after a complete switch of the first select signal YNi.

Advantageously, each global bit-line GBLi also comprises a discharge transistor controlled by a control signal M3_Even, M3_Odd complementary to the control signal of the discharge transistor Tsi of the adjacent global bit-line GBLi. The discharge transistors Tsi are activated for discharging the possible high voltage present in the local bit-line LBLij associated with the global bit-line GBLi after a programming.

Suitably, the programming step comprises a second step which provides a switch of the control signal M3_Even, M3_Odd, which disables the transistor associated with the enabled global bit-line GBLi and simultaneously the complementary control signal enables a discharge transistor Tsi associated with an adjacent global bit-line GBLi.

The second step also comprises a pulse programming of a selected cell belonging to the local bit-line LBLij enabled by the second select signal YOj and to a row enabled in the usual way.

Advantageously, thus, the present method allows to discharge a just programmed local bit-line LBLij during the programming of an adjacent bit-line. This, in fact, thanks to the complementary of the control signals M3_Even, M3_Odd which enable the discharge transistors Tsi associated with the global bit-line GBLi, while a bit-line is being programmed the just programmed bit-line is discharged.

Main advantage of the method according to an embodiment of the present invention is that of masking the discharge of a bit-line during the programming of a successive bit-line.

In particular, it is possible to realize devices which, although showing a similar programming method, have different valorizations.

In fact, for example, in the case of the device indicated in FIG. 5, each global bit-line GBLi is associated with a group of local bit-lines LBLij and at each switch of the first select signal YNi, by enabling a corresponding global bit-line GBLi, there occurs the programming of a local bit-line LBLij of the associated group.

In this embodiment, the control signal M3_Even, M3_Odd switches at each switch of the first select signal YNi and then, during the programming of a local bit-line LBLij, there is the discharge of a just programmed local bit-line LBLij belonging to a group associated with the previously enabled global bit-line GBLi.

At each complete switch of the first select signal YNi there is the programming of an enabled local bit-line LBLij of each group.

Instead, in the case of the device indicated in FIG. 7, a group of a defined number of consecutive local bit-lines LBLij are comb-shape associated with pairs of global bit-lines GBLi, which are divided into first and second bit-lines and are arranged in an alternated way.

Moreover, the local bit-lines LBLij associated with the first global bit-lines GBLi are enabled by second even select signals YOj, while those associated with the second global bit-lines GBLi are enabled by second odd signals YOj. The second select signals Yoj, even one and odd one, are controlled separately.

At each complete switch of the first select signal YNi there is the programming of two local bit-lines LBLij of each group associated with pairs of global bit-lines GBLi and in particular an even bit-line and an odd one.

In this embodiment, the control signals M3_Even, M3_Odd for each complete switch of the first select signals switch twice with a simultaneous discharge of the local bit-lines LBLij activated by a same second select signal YOj.

Instead, in the case of the device indicated in FIG. 12, the global bit-lines GBLi are arranged in sequence and activated by first select signals YNi sequentially. While, each group of local bit-lines LBLij are comb-like associated with pairs of consecutive global bit-lines GBLi alternatively activated by second even and odd select signals YOj.

The control signals M3_Even, M3_Odd switch at each switch of the first select signal YNi discharging at each switch a just programmed bit-line.

From the foregoing it will be appreciated that, although specific embodiments of the invention have been described herein for purposes of illustration, various modifications may be made without deviating from the spirit and scope of the invention.

What is claimed is:

1. A method comprising:
providing a plurality of global bitlines;
providing a plurality of local bitlines coupled to said global bitlines, each local bitline including a plurality of cells;
providing a discharge transistor for each of said global bitlines to discharge a local bitline coupled to said global bitline after cells coupled to said local bitline have been programmed; and
providing a discharge transistor to discharge one local bit-line connected to a global bitline while programming another local bitline.

2. The method of claim 1 including:
providing a decoder to generate a first select signal to enable a global bitline, and a second select signal to enable a local bitline, associated with said global bitline; and
providing a discharge transistor associated with the enabled global bitline associated with the programmed cell on the local bitline.

3. The method of claim 2 wherein each of the global bitlines is associated with a group of local bitlines and the method further comprises enabling programming of a local bitline of the group switch of the first select signal.

4. The method of claim 2 including enabling sequential activation of the global bitlines, arranged in sequence, by the first select signals and alternatively activation of each group of a number of local bitlines of a comb-shape associated with the consecutive global bitlines, by second select signals, even and odd, the method further comprising enabling switching of the control signals at each switch of the first select signal and discharging, at each switch, one bitline just programmed.

5. The method of claim 1 including enabling the global bitlines with p bits and addressing the first select signals and enabling the local bitlines with q bits and addressing the second select signals, one of the p and q bits being shared and suitable for activating the control signals.

6. A memory comprising:
a plurality of global bitlines;
a plurality of local bitlines coupled to said global bitlines, each local bitline including a plurality of cells;
a discharge transistor for each of said global bitlines to discharge a local bitline coupled to said global bitline after cells coupled to said local bitline have been programmed; and
a controller to discharge cells coupled to one local bitline while another local bitline is being programmed.

7. The memory of claim 6 including:
a plurality of global bitlines;
a plurality of local bitlines, each coupled to a global bitline, each local bitline including a discharge transistor, each discharge transistor controlled by a control signal complementary to the control signal of a discharge transistor on an adjacent local bitline; and
a decoder to enable the global bitlines with first select signals and to enable the local bitlines with second select signals.

8. The memory of claim 6 wherein each of the global bitlines is associated with a group of local bitlines and, said decoder, at each switch of the first select signal, to program a local bitline of the group.

9. The memory of claim 6, said decoder to activate the global bitlines, arranged in sequence, by the first select signals and alternatively activate each group of a number of local bitlines of a comb-shape associated with the consecutive global bitlines, by second select signals, even and odd, said decoder to switch the control signals at each switch of the first select signal and discharge, at each switch, one bitline just programmed.

10. The memory of claim 6, said decoder to enable the global bitlines with p bits which address the first select signals, and to enable the local bit-lines with q bits and addressing the second select signals, one of the p and q bits being shared and suitable for activating the control signals.

11. A method comprising:
discharging a local bitline coupled to a global bitline after cells coupled to said local bitline have been programmed; and
discharging a local bitline connected to a global bitline while programming another local bitline.

12. The method of claim 11 including:
enabling a global bitline with a first select signal generated by a decoder;
enabling a local bitline, associated with said global bitline, with a second select signal generated by the decoder;
pulse programming of an enabled cell belonging to the local bitline;
deactivating a discharge transistor associated with the enabled global bitline associated with the programmed cell on the local bitline; and
wherein each of the global bitlines is associated with a group of local bitlines and the method further comprises at each switch of the first select signal, programming of a local bitline of the group.

13. The method of claim 12 including sequentially activating the global bitlines, arranged in sequence, by the first select signals and alternatively activating each group of a number of local bitlines of a comb-shape associated with the consecutive global bitlines, by second select signals, even and odd, the method further comprising switching the control signals at each switch of the first select signal and discharging, at each switch, one bitline just programmed.

14. The method of claim 12 including enabling the global bitlines with p bits and addressing the first select signals and enabling the local bitlines with q bits and addressing the second select signals, one of the p and q bits being shared and suitable for activating the control signals.

* * * * *